United States Patent
Feng

(10) Patent No.: US 11,076,494 B2
(45) Date of Patent: Jul. 27, 2021

(54) FOLDABLE DISPLAY DEVICE

(71) Applicant: Wuhan China Star Optoelectronics Semiconductor Display Technology Co., Ltd., Wuhan (CN)

(72) Inventor: Zikang Feng, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/639,597

(22) PCT Filed: Jan. 13, 2020

(86) PCT No.: PCT/CN2020/071701
§ 371 (c)(1),
(2) Date: Feb. 17, 2020

(87) PCT Pub. No.: WO2021/036178
PCT Pub. Date: Mar. 4, 2021

(65) Prior Publication Data
US 2021/0068271 A1    Mar. 4, 2021

(30) Foreign Application Priority Data
Aug. 30, 2019 (CN) .......................... 201910813029.4

(51) Int. Cl.
*H05K 5/00*     (2006.01)
*H01L 51/52*    (2006.01)
*H05K 5/02*     (2006.01)

(52) U.S. Cl.
CPC ....... *H05K 5/0017* (2013.01); *H01L 51/5237* (2013.01); *H05K 5/0217* (2013.01); *H01L 2251/5338* (2013.01)

(58) Field of Classification Search
CPC ......................... H05K 5/0017; H05K 5/0217; H01L 51/5237; H01L 2251/5338; G06F 1/1652; G06F 1/1616
See application file for complete search history.

(56) References Cited

U.S. PATENT DOCUMENTS

| | | | |
|---|---|---|---|
| 9,179,559 B1 * | 11/2015 | Kim ................... | H04M 1/0268 |
| 9,891,663 B2 * | 2/2018 | Park ..................... | G06F 3/0487 |
| 10,043,421 B2 * | 8/2018 | Koo ...................... | G06F 1/1652 |
| 10,303,218 B2 * | 5/2019 | Jones ................... | G06F 1/1618 |
| 10,461,274 B2 * | 10/2019 | Kim ..................... | H01L 51/0097 |
| 10,711,980 B2 * | 7/2020 | Hirakata .............. | F21V 15/012 |
| D893,475 S * | 8/2020 | Kim ........................... | D14/345 |

(Continued)

FOREIGN PATENT DOCUMENTS

| | | |
|---|---|---|
| CN | 101681075 | 3/2010 |
| CN | 102916002 | 2/2013 |

(Continued)

*Primary Examiner* — Abhishek M Rathod

(57) ABSTRACT

Embodiments of the present disclosure provide a foldable display device comprising both an outwardly folding structure and an inwardly folding structure. Size differences generated in an outwardly folding process and an inwardly folding process can be compensated for each other by designing folding sizes of the structures, thereby achieving the purpose of matching the size of a mechanism and a display panel during folding process of the foldable display device.

7 Claims, 4 Drawing Sheets

(56) References Cited

U.S. PATENT DOCUMENTS

| | | | |
|---|---|---|---|
| 10,897,020 B2 * | 1/2021 | Wang | H01L 51/0097 |
| 10,957,867 B2 * | 3/2021 | Jeong | B32B 3/08 |
| 2009/0021666 A1 * | 1/2009 | Chen | G02F 1/133305 |
| | | | 349/58 |
| 2011/0216064 A1 * | 9/2011 | Dahl | G06F 1/1677 |
| | | | 345/428 |
| 2015/0023030 A1 * | 1/2015 | Tsukamoto | G06F 1/1626 |
| | | | 362/419 |
| 2015/0351232 A1 * | 12/2015 | Cok | H05K 1/0274 |
| | | | 156/204 |
| 2017/0025634 A1 * | 1/2017 | Jeong | G06F 1/1652 |
| 2017/0170417 A1 * | 6/2017 | Myung | H01L 51/0097 |
| 2017/0269452 A1 | 9/2017 | Van Lieshout et al. | |
| 2018/0107250 A1 * | 4/2018 | Cho | G09F 9/301 |
| 2018/0290430 A1 * | 10/2018 | Liu | G09F 9/30 |
| 2020/0064886 A1 * | 2/2020 | Cho | G06F 1/1616 |
| 2020/0098291 A1 * | 3/2020 | Wu | H01L 29/78603 |

FOREIGN PATENT DOCUMENTS

| | | |
|---|---|---|
| CN | 103135274 | 6/2013 |
| CN | 103624808 | 3/2014 |
| CN | 204408427 | 6/2015 |
| CN | 105513497 | 4/2016 |
| CN | 105522806 | 4/2016 |
| CN | 207561466 | 7/2018 |
| JP | H11-155643 | 6/1999 |
| JP | 2005-045317 | 2/2005 |

\* cited by examiner

FOLDABLE DISPLAY DEVICE

RELATED APPLICATIONS

The application is a National Phase of PCT Patent Application No. PCT/CN2020/071701 having International filing date of Jan. 13, 2020, which claims the benefit of priority of Chinese Patent Application No. 201910813029.4 filed on Aug. 30, 2019. The contents of the above applications are all incorporated by reference as if fully set forth herein in their entirety.

FIELD AND BACKGROUND OF THE INVENTION

The present disclosure relates to a display technology field, and in particular to a foldable display device.

With the development of science and technology, portable devices have become a new developing trend in modern society and are changing human life gradually, bringing significant changes in science and technology. In particular, flexible display panels become more and more popular among users due to their advantages of foldability, portability, and wide applicability. In addition, flexible display panels bring a brand-new viewing experience.

At present, organic light-emitting diode (OLED) display panels have the advantages of thinness, bendability, and foldability, and can be used in flexible display products, such as foldable mobile phones, smart watches, and in-vehicle display devices.

FIG. 1A is a schematic diagram illustrating a foldable display device having an OLED display panel in an unfolded state. A plane on which a rotation center O of a mechanism 300 is located, when the mechanism 300 is folded, is assumed as a neutral plane 301 (of which a length stays unchanged during the rotation). Due to a thickness of the mechanism itself, when the foldable display device is folded outwardly (as shown in FIG. 1B), an outer surface area of the mechanism 300 increases while a size of the display panel 100 remains unchanged, resulting in opposite ends of the mechanism 300 protruding over the display panel by $(R-r1)\pi/2$ (wherein R refers to a folding radius of the neutral plane 301 and r1 refers to a radius of an outer surface of the mechanism 300 after the foldable display device is being outwardly folded) in length after the foldable display device is being outwardly folded. When the foldable display device is folded inwardly (as shown in FIG. 1C), the size of the outer surface of the mechanism 300 decreases while the size of the display panel 100 remains unchanged, resulting in opposite ends of the mechanism 300 retracting relative to the display panel by $(R-r2)\pi/2$ (wherein r2 refers to a radius of an inner surface of the mechanism 300 after the foldable display device is being inwardly folded) in length after the foldable display device is being inwardly folded. Therefore, a mismatch between the mechanism 300 and the display panel 100 during the folding process of the foldable display device has become a problem hindering the development of the foldable display device.

In view of this, how to solve the mismatch between the mechanism and the display panel during the folding process of the foldable display device becomes an important research topic of relevant researchers and technicians.

SUMMARY OF THE INVENTION

Embodiments of the present disclosure provide a foldable display device comprising both an outwardly folding structure and an inwardly folding structure. Size differences generated in the outwardly folding process and in the inwardly folding process can be compensated with each other by designing folding sizes of the structures, thereby leading to a match of sizes of the mechanism and the display panel during the folding process of the foldable display device.

According to one aspect of the disclosure, an embodiment of the present disclosure provides a foldable display device. The foldable display device comprises a display panel and a mechanism, wherein the mechanism and the display panel are stacked and opposite ends of the mechanism are aligned with opposite sides of the display panel, the foldable display device has a folding area and a flat area, and the folding area and the flat area are alternately disposed, the folding area comprises at least one outwardly folding area and at least one inwardly folding area, and a quantity of the at least one outwardly folding area and a quantity of the at least one inwardly folding area are same.

Wherein the display panel and the mechanism are fixedly connected to each other in the flat area close to opposite sides of the display panel and the mechanism, and the display panel and the mechanism are slidably connected to each other in the flat area located at a center portion of the display panel and the mechanism and in the folding area; when the foldable display device is folded, an increase of an area of a surface area of the display panel in contact with the mechanism in the outwardly folding area is equal to a decrease of an area of a surface of the display panel in contact with the mechanism in the inwardly folding area; wherein the display panel in the flat area close to opposite sides of the display panel and the mechanism is connected to the mechanism by a fixing medium, and the display panel and the mechanism are connected to each other by a magnetic film in the flat area located at the center portion of the display panel and the mechanism and in the folding area.

According to the other aspect of the disclosure, an embodiment of the present disclosure provides a foldable display device. The foldable display device comprises a display panel and a mechanism, wherein the mechanism and the display panel are stacked and opposite ends of the mechanism are aligned with opposite sides of the display panel, the foldable display device has a folding area and a flat area, and the folding area and the flat area are alternately disposed, the folding area comprises at least one outwardly folding area and at least one inwardly folding area, and a quantity of the at least one outwardly folding area and a quantity of the at least one inwardly folding area are same. Wherein the display panel and the mechanism are fixedly connected to each other in the flat area close to opposite sides of the display panel and the mechanism, and the display panel and the mechanism are slidably connected to each other in the flat area located at a center portion of the display panel and the mechanism and in the folding area; when the foldable display device is folded, an increase of an area of a surface of the display panel in contact with the mechanism in the outwardly folding area is equal to a decrease of an area of a surface of the display panel in contact with the mechanism in the inwardly folding area.

In an embodiment of the present disclosure, the display panel in the flat area close to opposite sides of the display panel and the mechanism is connected to the mechanism by a fixing medium.

In an embodiment of the present disclosure, the fixing medium is made of adhesive materials.

In an embodiment of the present disclosure, the display panel in the flat area located at the center portion of the display panel and the mechanism and in the folding area is connected to the mechanism by a magnetic film.

In an embodiment of the present disclosure, the magnetic film is made from at least one of materials of ferrum (Fe), samarium-cobalt (Sm—Co) and neodymium-iron-nitrogen (Nd—Fe—N).

In an embodiment of the present disclosure, a linkage apparatus is disposed in the mechanism, the linkage apparatus is configured to make the mechanism in the flat area close to opposite sides of the display panel and the mechanism rotate at a same rate.

In an embodiment of the present disclosure, the mechanism in the flat area located at the center portion of the display panel and the mechanism comprises a sliding block structure, a surface of the sliding block structure and a corresponding position of the display panel are fixedly connected.

In an embodiment of the present disclosure, the display panel in a part of the flat area located at the center portion of the display panel and the mechanism is connected to the mechanism by a magnetic film.

In an embodiment of the present disclosure, the display panel in the flat area located at the center portion of the display panel and the mechanism and in the folding area is connected to the mechanism by a vacuum chamber structure.

In an embodiment of the present disclosure, the display panel in the flat area located at the center portion of the display panel and the mechanism and in the folding area is connected to the mechanism by a liquid film structure.

In contrast to the prior art, the embodiments of the present disclosure provide a foldable display device comprising both the inwardly folding area and the outwardly folding area in view of size differences between a display panel and a mechanism of an existing foldable display device. The size differences generated in the outwardly folding process and in the inwardly folding process can compensate for each other, thereby leading to the match of sizes of the mechanism and the display panel during the folding process of the foldable display device.

BRIEF DESCRIPTION OF THE SEVERAL VIEW OF THE DRAWINGS

To describe the technical solutions of the embodiments of the present disclosure more clearly, the following briefly introduces the accompanying drawings used in the description of the embodiments of the present disclosure. Apparently, the accompanying drawings described below illustrate only some exemplary embodiments of the present disclosure, and persons skilled in the art may derive other drawings from the drawings without making creative efforts.

DESCRIPTION OF SPECIFIC EMBODIMENTS OF THE INVENTION

Figure 1A:
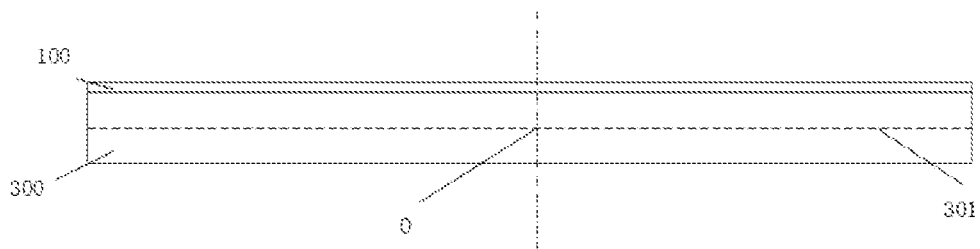
FIG. 1A is a schematic diagram illustrating a positional relationship of a display panel and a mechanism in the prior art.

The technical solutions in the embodiments of the present disclosure will be described clearly and completely hereafter with reference to the accompanying drawings. Apparently, the described embodiments are only a part of but not all embodiments of the present disclosure. All other embodiments obtained by persons of ordinary skill in the art based on the embodiments of the present disclosure without creative efforts shall fall within the protection scope of the present disclosure.

The terms "first", "second", "third", and the like in the description, claims, and drawings are used to distinguish between different objects, rather than used to indicate a specified order or sequence. It should be understood that the objects described in this way may be exchanged when appropriate. Furthermore, the terms "include" and "comprise" as well as any variants thereof are intended to cover a non-exclusive inclusion.

In the present disclosure, the accompanying drawings discussed hereinafter and various implementations for describing principles of the present disclosure are merely for illustration are not construed as a limitation on the scope of the present disclosure. It should be understood by persons skilled in the art that the principles of the present disclosure may be implemented in any suitably arranged device. A detailed description is provided for exemplary implementations, examples of which are illustrated in the accompanying drawings. In addition, terminals according to the exemplary implementations will be described in detail with reference to the accompanying drawings in which identical numerals represent identical elements.

The terminology used herein is for describing particular implementations only and is not intended to be limiting of the present disclosure. The singular form is intended to include the plural form as well, unless the context clearly indicates otherwise. It should be understood that the terms "comprise", "include" and "have", when used herein, intend to specify possibility of the presence of stated features, integers, steps, operations, or groups thereof disclosed in the present disclosure, but do not intend to preclude possibility of the presence or addition of one or more other features, integers, steps, operations, or groups thereof. In the drawings, identical reference numerals represent identical parts.

Embodiments of the present disclosure provide a foldable display device and are described in detail as below respectively.

Please refer to FIGS. 2 to 7. An embodiment of the present disclosure provides a foldable display device. The foldable display device comprises a display panel 100 and a mechanism 300, the mechanism 300 and the display panel 100 are stacked, and opposite ends of the mechanism 300 are aligned with opposite sides of the display panel 100. The foldable display device has a folding area and a flat area, and the folding area and the flat area are alternately disposed. The folding area comprises at least one outwardly folding area and at least one inwardly folding area 520, and the number of the at least one outwardly folding area and the number of the at least one inwardly folding area 520 are same. The display panel 100 and the mechanism 300 are fixedly connected to each other in the flat area close to opposite sides of the display panel 100 and the mechanism 300, and the display panel 100 and the mechanism 300 are slidably connected to each other in the flat area located at a center portion of the display panel 100 and the mechanism 300 and in the folding area. When the foldable display device is folded, an increase of an area of a surface of the display panel 100 in contact with the mechanism 300 in the outwardly folding area is equal to a decrease of an area of a surface of the display panel 100 in contact with the mechanism 300 in the inwardly folding area 520.

Figure 3:
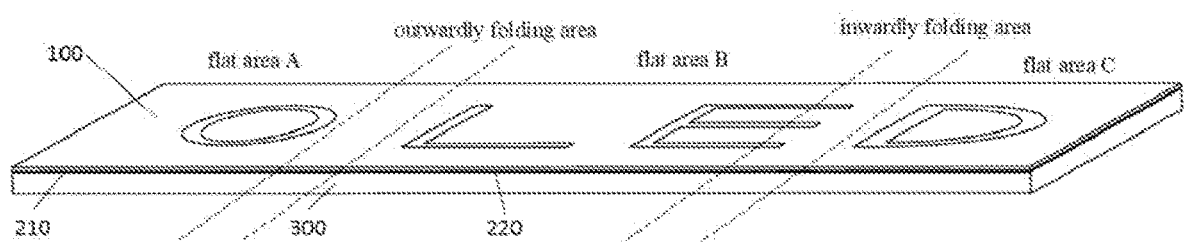
FIG. 3 is a schematic diagram illustrating the foldable display device in a flattened state according to an embodiment of the present disclosure.
Figure 4:
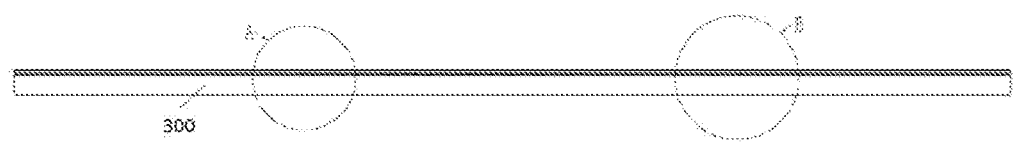
FIG. 4 is a front view illustrating the foldable display device in the flattened state according to the embodiment of the present disclosure.
Figure 5:
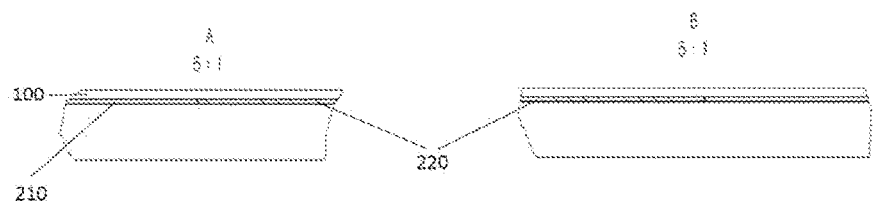
FIG. 5 is a partially enlarged schematic view of an area A and an area B of the foldable display device shown in FIG. 4.

In detail, in the embodiment, the number of the outwardly folding area and the inwardly folding area 520 is one each. Of course, in other embodiments, the number is not limited hereto. In addition, in the embodiment, the number of the flat areas is three and the flat areas are flat areas A and C close to opposite sides of the display panel 100 and the mechanism 300 and flat area B located at the center portion of the display panel 100 and the mechanism 300, as shown in FIG. 3.

In the embodiment, the display panel 100 in the flat area close to opposite sides of the display panel 100 and the mechanism 300 is connected to the mechanism 300 by a fixing medium 210. In detail, the fixing medium 210 is made of adhesive materials such as optically clear adhesive (OCA) which is a special adhesive for adhering a transparent optical element (e.g., a lens). The OCA has such advantages as being colorless and transparent, having a light transmittance of greater than 90%, excellent adhesion strength, being cured at a room or intermediate temperature, and having small curing shrinkage. In detail, the fixing medium 210 is disposed between the display panel 100 and the mechanism 300 in the flat area A and the flat area C, making the display panel 100 in the flat area A and the flat area C fixed to the mechanism 300 (allowing slight relative movement). The opposite sides of the display panel 100 are always aligned with the opposite ends of the mechanism 300 during a folding process and no misalignment in relative position is generated, so as to ensure aesthetics of the foldable display device and reliability of the connection between the display panel 100 and the mechanism 300 as well.

Figure 2:
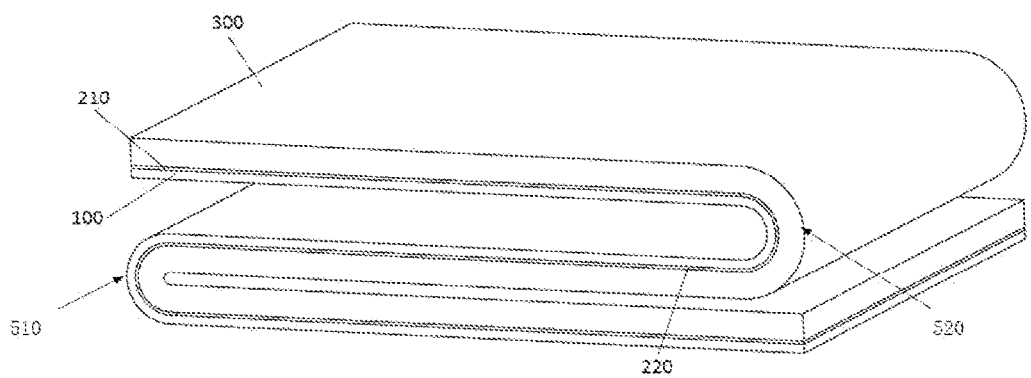
FIG. 2 is a schematic diagram illustrating a foldable display device in a folded state according to an embodiment of the present disclosure.
Figure 6:
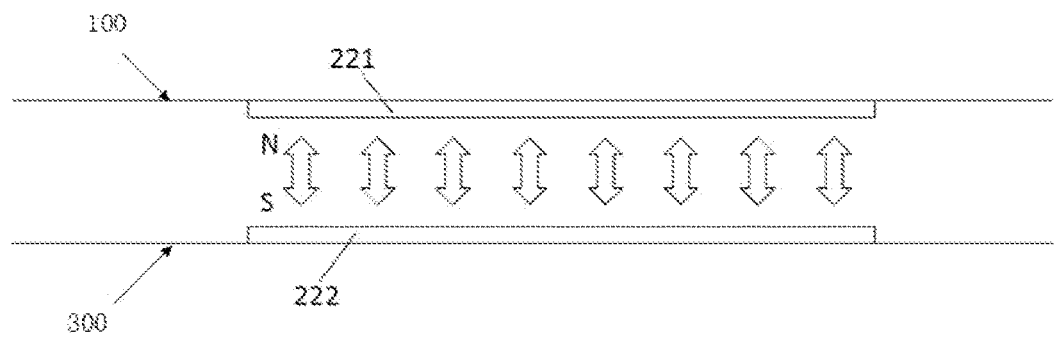
FIG. 6 is a schematic diagram illustrating operation of a magnetic film by magnetic force.

In the embodiment, the display panel 100 in the flat area located at the center portion of the display panel 100 and the mechanism 300 and in the folding area is connected to the mechanism 300 by a magnetic film 220, wherein the magnetic film 220 is made from at least one of materials of ferrum (Fe), samarium-cobalt (Sm—Co), or neodymium-iron-nitrogen (Nd—Fe—N). As shown in FIG. 2, the magnetic film 220 is coated on each of a lower surface of the display panel 100 and an upper surface of the mechanism 300 in the flat area B, the outwardly folding area 510 and the inwardly folding area 520. As shown in FIG. 6, by magnetic force, the display panel 100 and the mechanism 300 always keep contact while the display panel 100 and the mechanism 300 can slide relatively during the folding process.

Figure 1B:
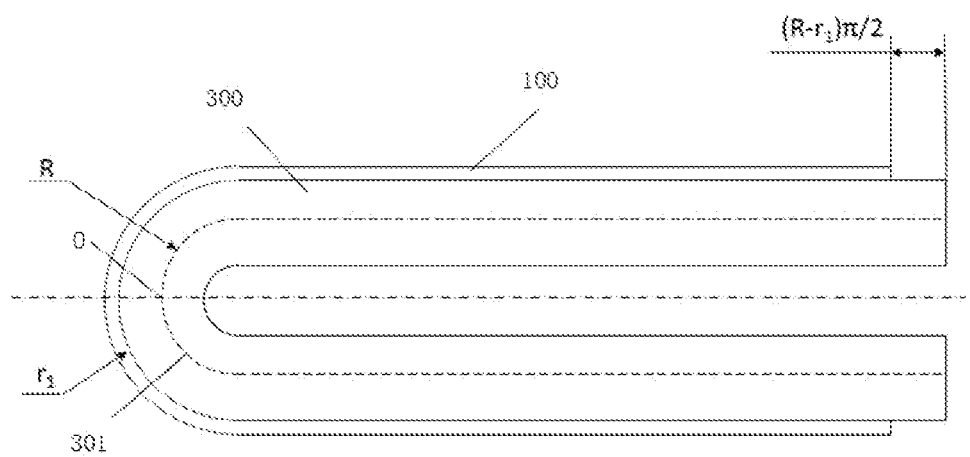
FIG. 1B is a schematic diagram illustrating a size difference between contact surfaces of the display panel and the mechanism in the prior art.
Figure 1C:
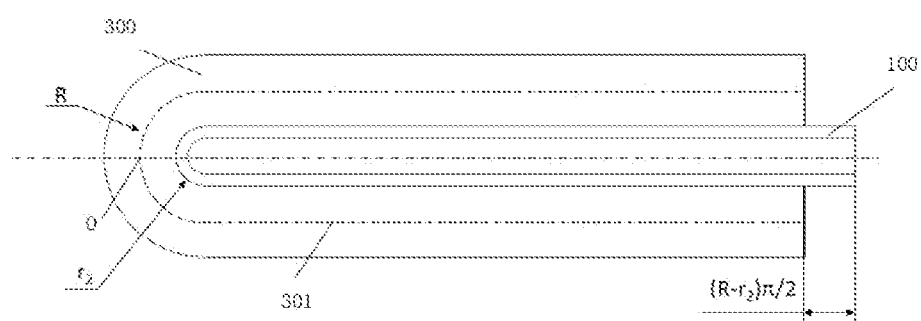
FIG. 1C is a schematic diagram illustrating a size difference between contact surfaces of the display panel and the mechanism in the prior art in another case.
Figure 7:
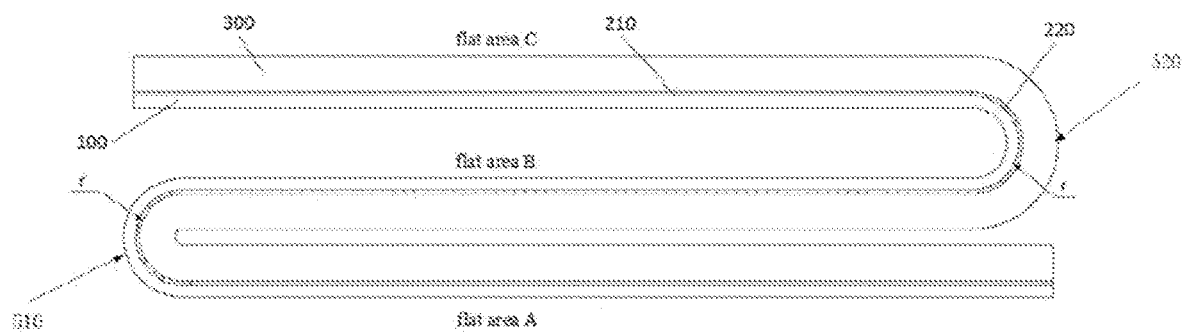
FIG. 7 is a front view illustrating the foldable display device in the folded state shown in FIG. 2.

FIG. 2 and FIG. 7 are schematic diagrams illustrating the foldable display device. During the folding process, the display panel 100 in the flat area B and the flat area C is fixedly connected to the mechanism 300 by the fixing medium 210 and no relative sliding movement is generated. The mechanism 300 is folded outwardly in the outwardly folding area 510 and the mechanism 300 is folded inwardly in the inwardly folding area 520. the size of the mechanism 300 in the outwardly folding area 510 shown in FIG. 1 after the foldable display device is being folded increases by $(R-r1)\pi$ and the size of the mechanism 300 in the inwardly folding area 520 decreases by $(R-r2)\pi$. Therefore, the size of the display panel 100 in the outwardly folding area 510 after the foldable display device is being outwardly folded relatively decreases $(R-r1)\pi$ and the size of the display panel 100 in the inwardly folding area 520 after the foldable display device is being inwardly folded relatively increases by $(R-r2)\pi$. By the new design of the mechanism 300, the radius r1 of the outer surface of the mechanism 300 after the mechanism 300 in the outwardly folding area 510 is being folded outwardly and the radius r2 of the inner surface of the mechanism 300 after the mechanism 300 in the inwardly folding area 520 is being folded inwardly are equal, which means $r1=r2=r$ and folding radii of two neutral planes 301 are R. Thus, size differences generated in the outwardly folding process of the display panel 100 and the mechanism 300 in the outwardly folding area 510 and generated in the inwardly folding process of the display panel 100 and the mechanism 300 in the inwardly folding area 520 can be compensated for each other. That is to say, a size of a whole contact position of the display panel 100 and the mechanism 300 remains unchanged, keeping sizes of the mechanism 300 and the display panel 100 same.

Furthermore, in the flat area B, the outwardly folding area 510 and the inwardly folding area 520, the display panel 100 and the mechanism 300 are magnetically connected and can move relatively during the folding process of the foldable display device. Therefore, the increase of the area of the surface of the display panel 100 in the inwardly folding area 520 due to a squeezing action of the mechanism 300 when the display panel 100 is bent can compensate the decrease of the area of the surface of the display panel 100 in the outwardly folding area 510 due to a squeezing action of the mechanism 300 when the display panel 100 is folded in a direction from the flat area B toward the outwardly folding area 510. The amount of the increase and the decrease is same, thereby achieving a purpose of a match of sizes of the mechanism 300 and the display panel 100.

Moreover, in the embodiment, a linkage apparatus (not shown) is disposed in the mechanism 300, the linkage apparatus is configured to make the mechanism in the flat area (which is the flat area A and the flat area C) close to opposite sides of the display panel 100 and the mechanism 300 rotate at a same rate, achieving the inwardly folding process and the outwardly folding process, thereby ensuring an area of a contact surface of the display panel 100 and the mechanism 300 remains unchanged during the folding process. That is to say, by movements of the flat area B, the outwardly folding area 510 and the inwardly folding area 520, the size differences between the display panel 100 and the mechanism 300 caused by the outwardly folding process and the inwardly folding process can be compensated for each other.

Figure 8:
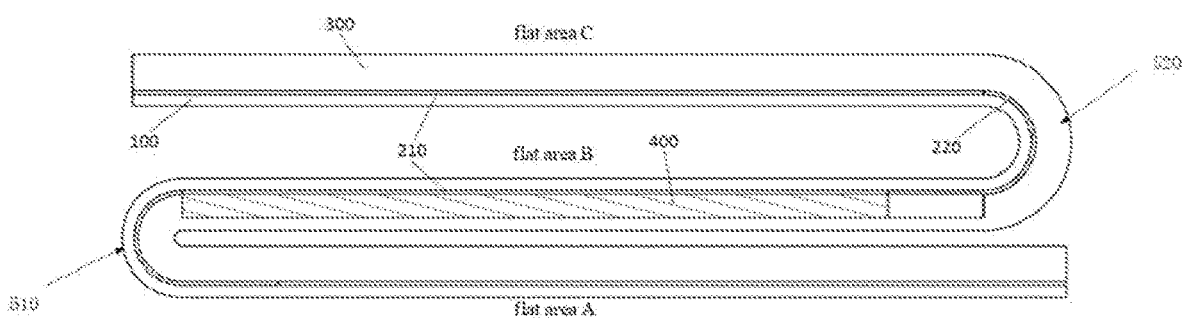
FIG. 8 is a schematic diagram illustrating the foldable display device according to an embodiment of the present disclosure.
Figure 9:
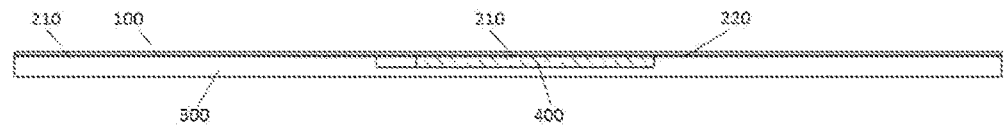
FIG. 9 is a schematic diagram illustrating a mechanism comprising a sliding block structure of the foldable display device shown in FIG. 8.

In an embodiment of the present disclosure, the mechanism 300 in the flat area (which is the flat area B) located at the center portion of the display panel 100 and the mechanism 300 comprises a sliding block structure 400. As shown in FIG. 8 and FIG. 9, a surface of the sliding block structure 800 and a corresponding position of the display panel 100 are fixedly connected. In addition, the display panel 100 in a part of the flat area B located at the center portion of the display panel 100 and the mechanism 300 is connected to the mechanism 300 by the magnetic film 220.

That is to say, the mechanism 300 in the flat area B comprises the sliding block structure 400. The surface of the sliding block structure 400 and the display panel 100 are fixedly connected by the a fixing medium 210 and do not move relatively. While a magnetic film 220 is coated in the flat area B and an area of the lower surface of the display panel 100 not in contact with the sliding block structure 400, the magnetic film 220 is coated in the outwardly folding area 510 and the inwardly folding area 520 as well. When the mechanism 300 is folded, the display panel 100 in the flat area B and the sliding block structure 400 move together, achieving an effect that the size differences generated in the outwardly folding process and in the inwardly folding process are compensated for each other. In addition, reliability of the mechanism 300 can be improved by providing the sliding block structure 400.

Figure 10:
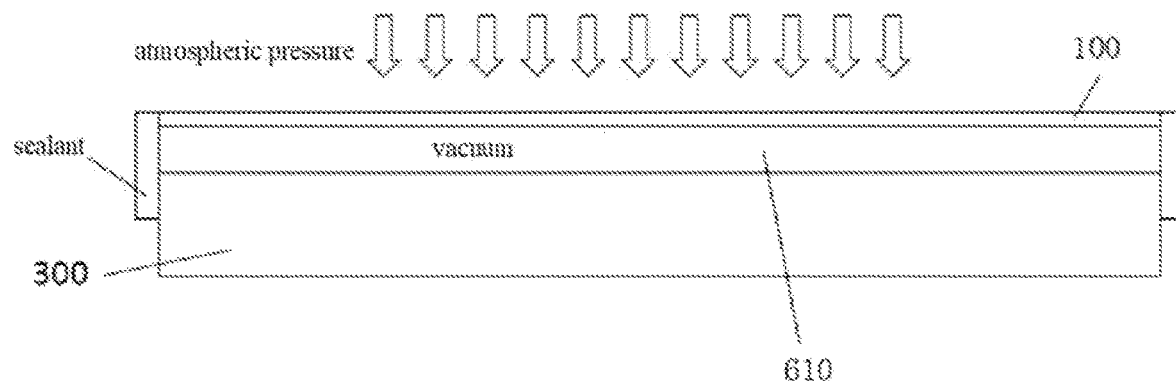
FIG. 10 is a schematic diagram illustrating a vacuum chamber structure according to an embodiment of the present disclosure.

In an embodiment of the present disclosure, the display panel 100 in the flat area B located at the center portion of the display panel 100 and the mechanism 300 and in the folding areas 510 and 520 is connected to the mechanism 300 by a vacuum chamber structure 610. That is to say, in the foldable display device, a contact way of using the magnetic force of the magnetic film 220 is replaced with a contact way of using the vacuum chamber structure 610. As shown in FIG. 10, the display panel 100 and the mechanism 300 are in contact in up and down directions, while allowing relative movement in left and right directions. In detail, after the display panel 100 and the mechanism 300 are attached, opposite sides of the display panel 100 and the mechanism 300 are sealed by a special sealing process, thereby forming the vacuum chamber. Due to the effect of the atmospheric pressure, the display panel 100 and the mechanism 300 are in contact in up and down directions, while allowing relative movement in left and right directions. Therefore, when the foldable display device is folded, the compensation for the size differences generated in the outwardly folding process and in the inwardly folding process is achieved by the sliding movement of the display panel 100.

Figure 11:
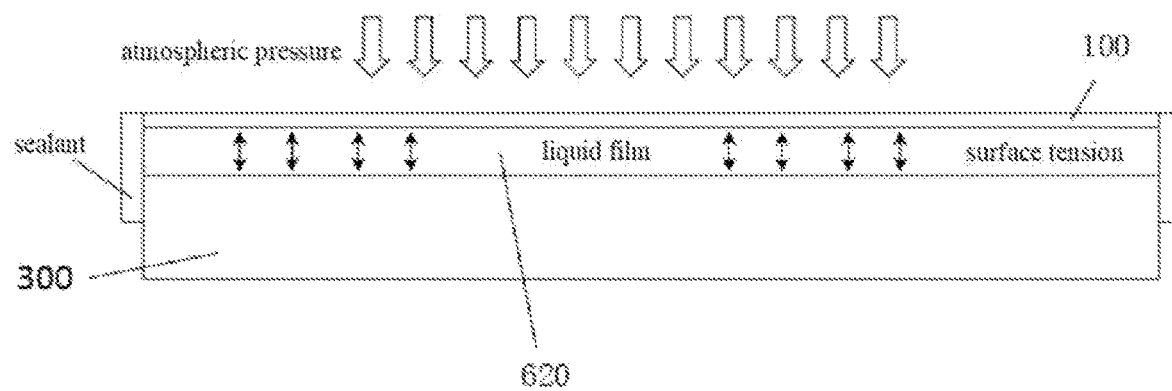
FIG. 11 is a schematic diagram illustrating a liquid film structure according to an embodiment of the present disclosure.

In an embodiment of the present disclosure, the display panel 100 in the flat area B located at the center portion of the display panel 100 and the mechanism 300 and in the folding areas 510 and 520 is connected to the mechanism 300 by a liquid film structure 620. The reason that two pieces of glass stained with water and then stuck together cannot be easily separated is that the water exhausts the air between the glass, creating a vacuum, the atmospheric pressure holds the two pieces of glass together, and the effect of the surface tension between the water and the glass causes the two pieces of glass to stick together as well. Utilizing the theory in the embodiment of the present disclosure, a contact way of using the magnetic force of the magnetic film 220 is replaced with a contact way of using combination of the atmospheric pressure and the capillary force (generated by using the liquid film structure 620). As shown in FIG. 11, the display panel 100 and the mechanism 300 are in contact in up and down directions, while allowing relative movement in left and right directions. In detail, a special liquid is filled between the display panel 100 and the mechanism 300. The special liquid is required to have a certain lubrication effect, and the surface tension between the special liquid and the lower surface of the display panel 100 and that between the special liquid and the upper surface of the mechanism 300 enable the close contact of the display panel 100 and the mechanism 300. Then opposite sides of the display panel 100 and the mechanism 300 are sealed by a special sealing process, forming the liquid film structure between the display panel 100 and the mechanism 300. Due to the effect of the atmospheric pressure and the surface tension (which is capillary force), the display panel 100 and the mechanism 300 are in contact, while allowing relative movement in left and right directions. Thereby, when the foldable display device is folded, the compensation for the size differences generated in the outwardly folding process and in the inwardly folding process is achieved by the movement of the display panel 100.

The descriptions above are just embodiments of the present disclosure. It should be pointed out that, to the general technical personnel in the art, not out of the premise of principle of the present disclosure, some improvement and decoration can be done, these improvements and decoration should also be in the protection scope of the present disclosure.

What is claimed is:

1. A foldable display device, comprising:
a display panel; and
a mechanism, wherein the mechanism and the display panel are stacked and opposite ends of the mechanism are aligned with opposite sides of the display panel;
wherein the foldable display device has a folding area and a flat area, the folding area and the flat area are alternately disposed, the folding area comprises at least one outwardly folding area and at least one inwardly folding area, and a number of the at least one outwardly folding area and a number of the at least one inwardly folding area are same;
wherein the display panel and the mechanism are fixedly connected to each other in the flat area close to opposite sides of the display panel and the mechanism, and the display panel and the mechanism are slidably connected to each other in the flat area located at a center portion of the display panel and the mechanism and in the folding area; when the foldable display device is folded, an increase of an area of a surface of the display panel in contact with the mechanism in the outwardly folding area is equal to a decrease of an area of a surface of the display panel in contact with the mechanism in the inwardly folding area; and
wherein the display panel in the flat area close to the opposite sides of the display panel and the mechanism is connected to the mechanism by a fixing medium, and the display panel and the mechanism are connected to each other by a magnetic film in the flat area located at the center portion of the display panel and the mechanism and in the folding area.

2. A foldable display device comprising:
a display panel; and
a mechanism, wherein the mechanism and the display panel are stacked and opposite ends of the mechanism are aligned with opposite sides of the display panel;
wherein the foldable display device has a folding area and a flat area, the folding area and the flat area are alternately disposed, the folding area comprises at least one outwardly folding area and at least one inwardly folding area, and a number of the at least one outwardly folding area and a number of the at least one inwardly folding area are same; and wherein the display panel and the mechanism are fixedly connected to each other in the flat area close to opposite sides of the display panel and the mechanism, and the display panel and the mechanism are slidably connected to each other in the flat area located at a center portion of the display panel and the mechanism and in the folding area, when the foldable display device is folded an increase of an area of a surface of the display panel in contact with the mechanism in the outwardly folding area is equal to a decrease of an area of a surface of the display panel in contact with the mechanism in the inwardly folding area; and wherein the display panel in the flat area located at the center portion of the display panel and the mechanism and the display panel in the folding area are connected to the mechanism by a magnetic film.

3. The foldable display device as claimed in claim 2, wherein the display panel in the flat area close to the opposite sides of the display panel and the mechanism is connected to the mechanism by a fixing medium.

4. The foldable display device as claimed in claim 3, wherein the fixing medium is made of adhesive materials.

5. The foldable display device as claimed in claim 2, wherein the magnetic film is made from at least one of materials of ferrum, samarium-cobalt, or neodymium-iron-nitrogen.

6. The foldable display device as claimed in claim 2, wherein a linkage apparatus is disposed in the mechanism, and the linkage apparatus is configured to make the mechanism in the flat area close to the opposite sides of the display panel and the mechanism rotate at a same rate.

7. The foldable display device as claimed in claim 2, wherein the mechanism in the flat area located at the center portion of the display panel and the mechanism comprises a sliding block structure, and a surface of the sliding block structure and a corresponding position of the display panel are fixedly connected.

* * * * *